(12) United States Patent
Eslamy (10) Patent No.: US 6,485,843 B1
(45) Date of Patent: Nov. 26, 2002

(54) APPARATUS AND METHOD FOR MOUNTING BGA DEVICES

(75) Inventor: Mohammad Eslamy, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/966,528

(22) Filed: Sep. 28, 2001

Related U.S. Application Data
(60) Provisional application No. 60/236,496, filed on Sep. 29, 2000.

(51) Int. Cl.[7] .............................. B22F 7/00; H01L 23/48
(52) U.S. Cl. .................... 428/548; 428/617; 428/618; 428/675; 428/929; 257/779; 257/781
(58) Field of Search ................................ 257/779, 781; 428/548, 617, 618, 675, 929

(56) References Cited

U.S. PATENT DOCUMENTS

| | | | | |
|---|---|---|---|---|
| 3,436,818 A | * | 4/1969 | Merrin et al. | |
| 4,081,601 A | * | 3/1978 | Dinella et al. | 174/68.5 |
| 4,940,181 A | * | 7/1990 | Juskey, Jr. et al. | 228/180.2 |
| 6,130,476 A | * | 10/2000 | LaFontaine, Jr. et al. | 257/678 |
| 6,130,479 A | * | 10/2000 | Chalco et al. | 257/734 |
| 6,180,265 B1 | * | 1/2001 | Erickson | 428/652 |
| 6,261,864 B1 | * | 7/2001 | Jung et al. | 438/106 |
| 6,306,751 B1 | * | 10/2001 | Patel et al. | 438/614 |
| 6,337,522 B1 | * | 1/2002 | Kang et al. | 257/784 |
| 6,358,630 B1 | * | 3/2002 | Tsukada et al. | 428/646 |

* cited by examiner

Primary Examiner—Cathy Lam
(74) Attorney, Agent, or Firm—Pennie & Edmonds LLP (57) ABSTRACT

A surface-mount device attach method for attaching solder ball-grid array or solder column-grid array surface-mount devices to a printed circuit board where the conventional solder mask structure is replaced with a layer of plated nickel to prevent printed circuit board warping caused by the mismatch in the coefficients of thermal expansion between the conventional solder mask and the printed circuit board. A native nickel-oxide layer that forms on the surface of the exposed portions of the plated nickel layer functions as a solder dam.

25 Claims, 7 Drawing Sheets

APPARATUS AND METHOD FOR MOUNTING BGA DEVICES

This application claims the benefit of U.S. Provisional Application No. 60/236,496, filed Sep. 29, 2000.

BRIEF DESCRIPTION OF THE INVENTION

This invention.relates to an improved method for mounting surface-mount technology (SMT) devices such as solder ball-grid array (BGA) or solder column grid array (CGA) devices onto a printed circuit board.

BACKGROUND OF THE INVENTION

Among the variety of SMT attach methods available in the electronic packaging industry, BGA and CGA devices are often used for attaching devices with high I/O requirements. In these SMT device attach systems, an array of solder balls or solder columns form both the electrical and structural interconnections between the SMT device and the printed circuit (PC) board.

In a BGA attach system, the PC board is provided with one or more BGA device bonding sites and each site is provided with an array of bonding pads that matches the array of solder ball interconnections on the BGA device. To attach the BGA device onto the PC board, low-temperature solder paste, whose reflow temperature is lower than that of the BGA solder balls, is deposited onto each of the bonding pads on the PC board. Solder paste made from eutectic Pb—Sn solder is typically used for this application. The BGA device is then aligned and placed on a device bonding site so that the array of BGA solder balls is aligned with the array of bonding pads on the PC board. The whole assembly is then heated to a temperature sufficiently high to melt the low temperature solder paste and form metallurgical bonds between the BGA solder balls and the bonding pads. Because the solder paste has a lower melting point than the BGA solder balls, only the solder paste melts during the BGA bonding process step.

Figure 1:
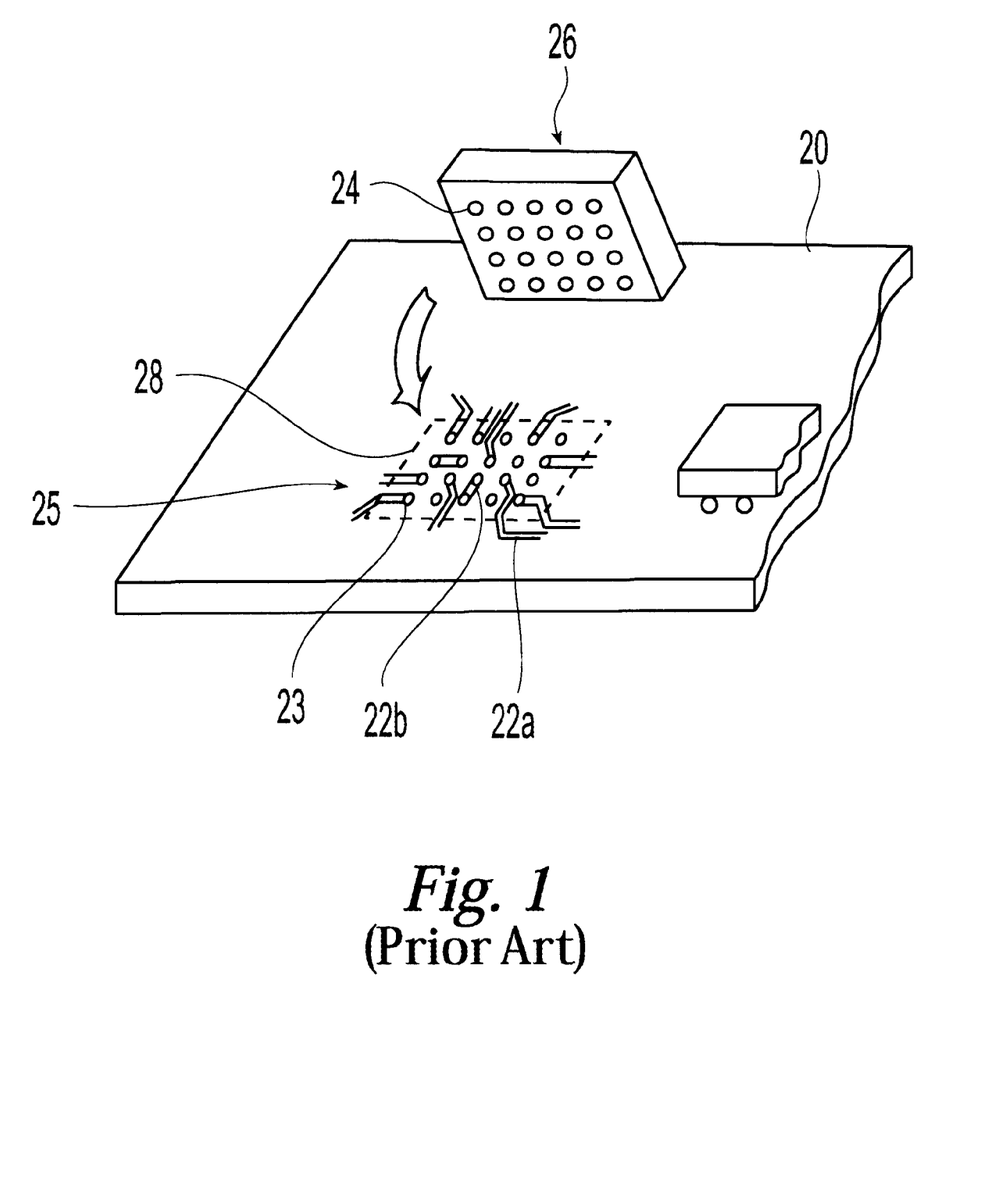
FIG. 1 illustrates a prior art BGA attach assembly system.

In addition to the bonding pads, a PC board typically has surface-wiring structures that provide electrical connections between various points on the surface of the PC board. Many of the bonding pads are connected to other bonding pads within the same surface-mount device bonding site or to various other points on the surface of the PC board through these surface-wiring structures. For example, FIG. 1 illustrates a conventional BGA device assembly system. In FIG. 1, a prior art PC board 20 is shown with a BGA device bonding site 25. BGA device bonding site 25 has an array of bonding pads 23 configured to match the array of solder balls 24 on BGA device 26. And as discussed above, some of the bonding pads are shown as being connected to surface-wiring structures 22a and 22b. Two types of surface-wiring structures 22a and 22b are shown for illustrative purposes. Surface-wiring structure 22a connects those bonding pads to other parts of the PC board and surface-wiring structure 22b connects two bonding pads.

Bonding pads 23 and surface-wiring structures 22a and 22b are typically formed from the PC board's surface metallurgy generally comprising a layer of copper (Cu) base conductor layer deposited on the PC board's surface. The Cu base conductor layer is deposited in patterns forming bonding pads 23 and surface-wiring structures 22a and 22b. Then very thin layers of nickel (Ni) and gold (Au) are deposited over the Cu at bonding pads 23. The remaining Cu base conductor layer portions without any additional metal layers form surface-wiring structures 22a and 22b. The metal layers are typically deposited using processes such as electrolytic plating or electro-less plating that are well-known in the electronics industry.

The layer of Ni plated on top of the Cu layer at bonding pads 23 functions as an adhesion promoting layer between the Cu and Au layers and also as a diffusion barrier between the Cu and Au layers. The Au layer provides corrosion protection.

The BGA device bonding site is then coated with a layer of solder mask 28. Solder mask 28 is typically a layer of organic material, such as polyimide and covers the whole BGA device bonding site but has apertures exposing the Au surface of the bonding pads 23 to allow the BGA solder balls to bond to them. Because solder does not wet to the solder mask material, the solder mask functions as a dam around each bonding pad and prevents the molten solder from bleeding out along the surface-wiring structures during the BGA bonding process. And because of its electrically insulating property, solder mask 28 also functions as a passivation layer protecting the surface-wiring structures 22a and 22b.

Figure 2:
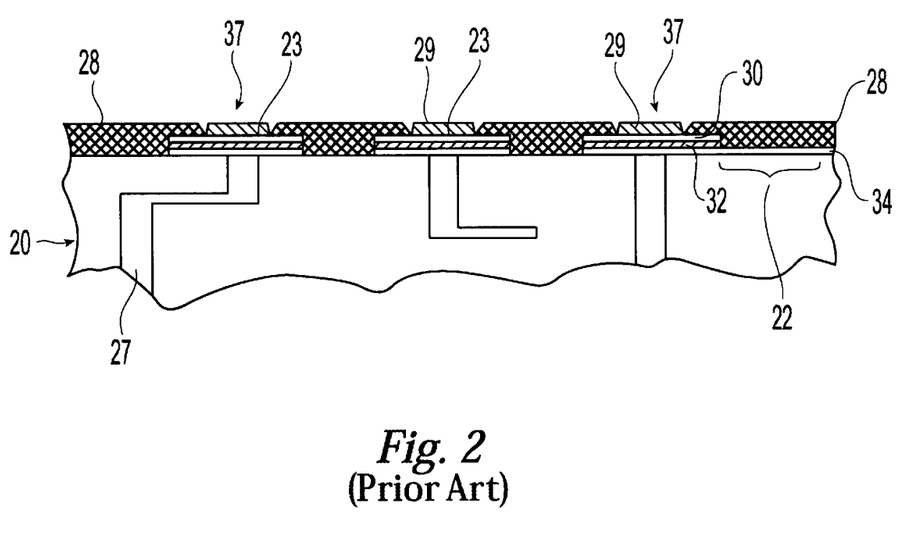
FIG. 2 illustrates a cross-sectional view of the PC board of the prior art BGA attach assembly of FIG. 1.
Figure 3:
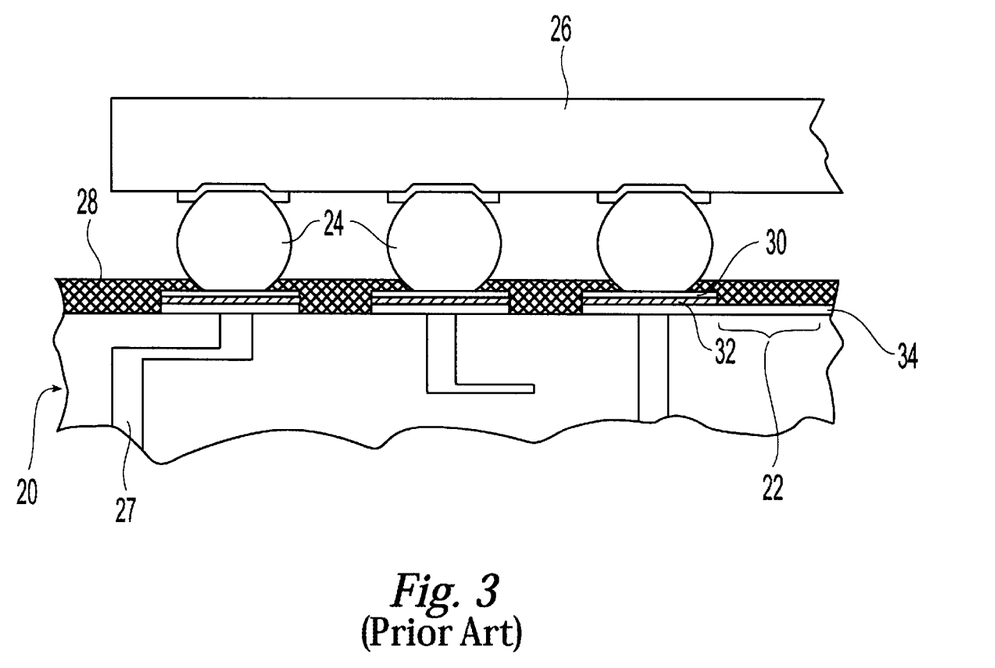
FIG. 3 illustrates a BGA device bonded to a PC board according to the prior art process.

FIGS. 2 and 3 illustrate the details of a conventional BGA assembly structure using a solder mask. FIG. 2 illustrates a cross-sectional view of BGA bonding site 25 from FIG. 1 before the BGA device is bonded to the PC board. The Cu/Ni/Au multi-layer structure of bonding pads 23 is shown by the reference numbers 34, 32, 30 respectively. As discussed above, surface-wiring structure 22 consists of the Cu layer only and does not have Ni or Au plated over it.

The BGA bonding site is coated with a solder mask layer 28 that has apertures 37. Apertures 37 expose Au layer 30 of the bonding pads for bonding to BGA solder balls. To bond a BGA device to BGA bonding site 25, low-temperature solder paste 29 is first deposited onto the bonding pads using typical solder paste deposition techniques used in the industry. Some examples are an off-contact printing process, such as screen printing, or an on-contact printing process, such as stenciling.

After the solder paste has been deposited, a BGA device is aligned and placed onto the bonding site so that BGA solder balls 24 align with corresponding bonding pads. The whole assembly is then heated to an elevated temperature sufficiently high to melt the low temperature solder paste. Upon cooling, the low temperature solder forms metallurgical bonds with BGA solder balls 24 and the bonding pads. PC board 20 is also shown with a multi-layer internal structure with internal wiring metallurgy 27 such as is found in many PC boards.

FIG. 3 illustrates the cross-sectional view of PC board 20 after BGA device 26 has been bonded to BGA bonding site 25. Solder balls 24 are bonded to bonding pads 23 and form the interconnections between BGA device 26 and PC board 20.

A problem with this conventional BGA attach system is that because the solder masks are formed from materials with relatively high coefficients of thermal expansion (CTE) compared to the CTE of the PC board, the mismatch of CTEs between the solder mask and the PC board causes the PC board to warp after the assembly is exposed to elevated temperature during the BGA bonding process. For example, the CTE of a typical polyimide solder mask is about 500× $10^{-7}/°$ C. compared to the CTE of Fr-4, a typical PC board material, which is about 158×$10^{-7}/°$ C. Because the solder mask has higher CTE, it expands more than the PC board. But, because the BGA bonding process temperature is above the glass transition temperature (Tg) of the solder mask, there is no stress transmitted to the PC board during the high temperature stage of the bonding process. However, upon cooling down to the room temperature, below the Tg of the solder mask, the solder mask and the PC board shrink at different rates, causing the PC board to warp.

This poses a significant reliability concern. In many electronic devices, the component assemblies undergo many thermal cycles as the devices are turned on and off during their use. These thermal cycles strain the solder interconnections because the solder mask and the PC board expand and contract different amounts and eventually may result in metal fatigue failure of the solder interconnections.

An additional problem associated with the use of a conventional solder mask is that the interface between the solder mask and the Au plated surface-wiring is subject to degradation. The degradation may be in the form of de-lamination or peeling.

SUMMARY OF THE INVENTION

The invention provides a PC board with at least one SMT device bonding site for mounting SMT devices comprising: at least one surface for mounting one or more SMT devices; at least one base conductor layer plated on a portion of the surface; at least one plated Ni outer layer deposited on the base conductor layer; and an array of bonding pads formed by selectively plating at least one layer of Au on a portion of the plated Ni outer layer, and leaving a remainder of the plated Ni outer layer exposed to form a layer of native nickel-oxide. This structure, where a plated Ni outer layer covers the base conductor layer, eliminates the need for the conventional solder mask. And because solder does not wet to the layer of native nickel-oxide on the surface of the plated Ni outer layer it serves as a solder dam preventing the molten solder balls from wetting and bleeding out beyond the bonding pads.

A typical conductor material, Cu, may be used for the base conductor layer. Alternatively the base conductor layer may have a multi-layer structure having Cu/Ni/Au layers where Au is the top layer.

The invention also includes a method of forming a PC board for mounting surface-mount devices without utilizing a conventional solder mask. The process includes providing a printed circuit board having at least one surface having at least one surface-mount device bonding site; plating at least one base conductor layer on a portion of said surface; plating at least one plated nickel outer layer on said base conductor layer; and selectively plating at least one layer of gold on a portion of said plated nickel outer layer to form an array of gold bonding pads at said surface-mount device bonding site and leaving a remainder of said plated nickel outer layer exposed to form a layer of native nickel-oxide.

It would be appreciated by one of ordinary skill in the art that the metal layers described above, such as the base conductor layer, the Ni outer layer, and the Au layer may be deposited using electrolytic plating as well as electro-less plating processes.

BRIEF DESCRIPTION OF THE DRAWINGS

For a better understanding of the invention, reference should be made to the following detailed description taken in conjunction with the accompanying drawings, in which.

The drawings are only schematic and are not to scale. Like reference numerals refer to corresponding parts throughout the drawings.

DETAILED DESCRIPTION OF THE INVENTION

The present invention addresses the PC board warping concerns associated with the use of solder masks in the prior art BGA attach systems by eliminating the solder mask. Although the present invention is equally applicable to BGA devices and other SMT devices such as CGA devices, for ease of discussion, BGA application will be discussed as an example. But those skilled in the art will readily recognize the applicability of the present invention to other SMT devices.

Figure 4:
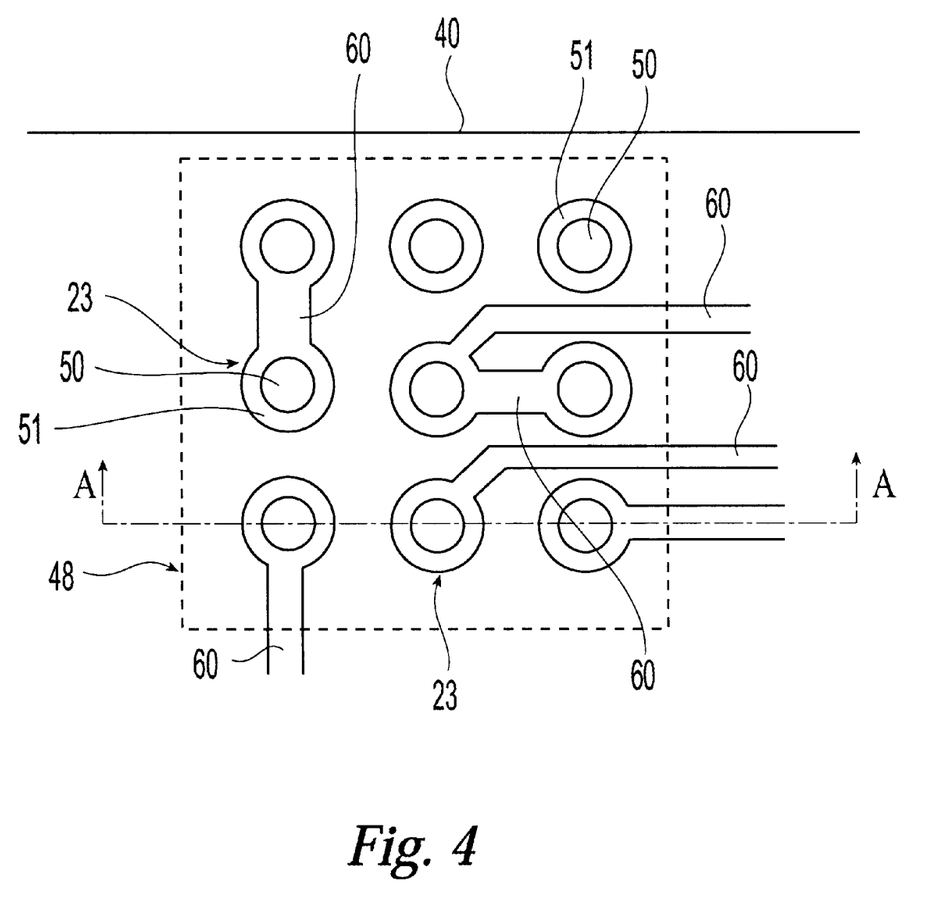
FIG. 4 illustrates a top-down view of bonding pads on a PC board constructed in accordance with the invention.

FIG. 4 illustrates a top-down view of a BGA device bonding site 48 on a PC board 40 constructed in accordance with an embodiment of the invention. This exemplary BGA device bonding site has a 3×3 array of bonding pads 23 and surface-wiring structures 60 that are formed from at least one plated Ni outer layer deposited over a base conductor layer of Cu.

Each bonding pad 23 is a continuous layer 50 of Au that has been selectively plated on a portion of the plated Ni outer layer. The Au layer provides a bonding surface having an excellent solder-wetting characteristic and corrosion resistance. The remaining portion of the plated Ni outer layer is left exposed, allowing its surface to oxidize and form a layer of native nickel-oxide. Thus, the surfaces of peripheral portions 51 of bonding pads 23 and surface-wiring structures 60 are covered with a layer of native nickel-oxide.

Because solder does not wet to the layer of native nickel-oxide, the plated nickel outer layer and its native nickel-oxide surface functions like the conventional solder mask and prevent molten BGA solder balls from wetting along the surface-wiring structures 60 and bleeding out beyond the bonding pad 23.

Figure 5:
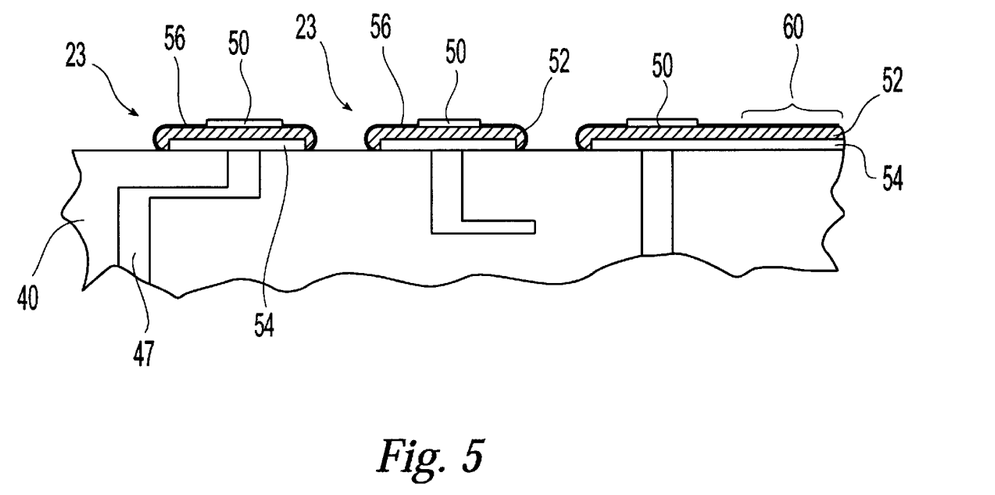
FIG. 5 illustrates a cross-sectional view of the PC board from FIG. 3 through the cross-sectional plane A—A.

The plated metal layers may be plated using electrolytic or electro-less plating processes. The typical thicknesses of the Cu base conductor layer and the selectively plated Au layer are about 0.25–0.5 mils and 0.02–0.05 mils respectively. A preferred range of thickness for the plated Ni outer layer is about 0.075–0.3 mils. FIG. 5 illustrates a cross-sectional view of PC board 40 of FIG. 4 along the plane A—A. Each bonding pad 23 consists of a base conductor layer 54 of Cu, at least one plated Ni outer layer 52, and at least one selectively plated Au layer 50. A layer of native nickel-oxide 56 is formed on the exposed surface of plated Ni outer layer 52. Au layer 50 provides the bonding surface for the BGA solder balls while layer of native nickel-oxide 56 passivates surface-wiring structures 60 and also functions as a solder dam at each of bonding pads 23 preventing the molten solder from bleeding out onto surface-wiring structures 60 during the BGA bonding process step.

Thus in accordance with the invention, native nickel-oxide layer 56 replaces the conventional solder mask of the prior art BGA attach systems. And because the conventional solder mask, whose CTE is substantially greater than that of the PC board, is eliminated and the plated Ni outer layer 52 and Cu base conductor layer 54 have CTEs that more closely match the CTE of the PC board, the PC board warping concern associated with the prior art solder mask systems is reduced. A comparison of the CTEs for a typical PC board material Fr-4, Cu, Ni, and conventional solder mask material is shown below:

| Materials | Coefficient of Thermal Expansion $10^{-7}/°$ C. |
|---|---|
| Fr-4 (typical PC board) | 158 |
| Cu | 170 |
| Ni | 133 |
| Polyimide (typical solder mask material) | 500 |

Figure 6:
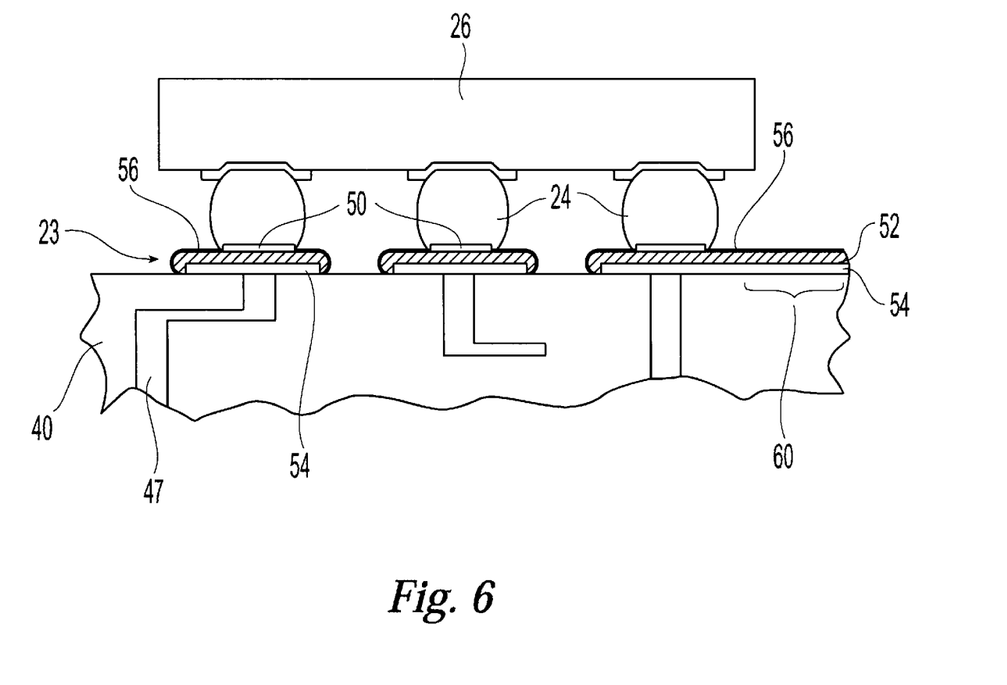
FIG. 6 illustrates the cross-sectional view of the PC board from FIG. 4 with a BGA device bonded to the PC board.

FIG. 6 illustrates a cross-sectional view of PC board 40 of FIG. 5 where a BGA device 26 has been bonded to PC board 40. Low-temperature solder paste is first deposited onto the bonding pads by screen printing or on-contact printing process. The BGA device is then placed onto the BGA bonding site and heated to a temperature sufficiently high to melt the low temperature solder. Upon cooling, the low-temperature solder forms metallurgical bonds between BGA solder balls 24 and bonding pads 23. Plated Ni outer layer 52 with its native nickel-oxide layer 56 functions as a solder dam at bonding pads 23 and contains solder balls 24 on the bonding pads while the low temperature solder is in its molten sate.

Figure 7:
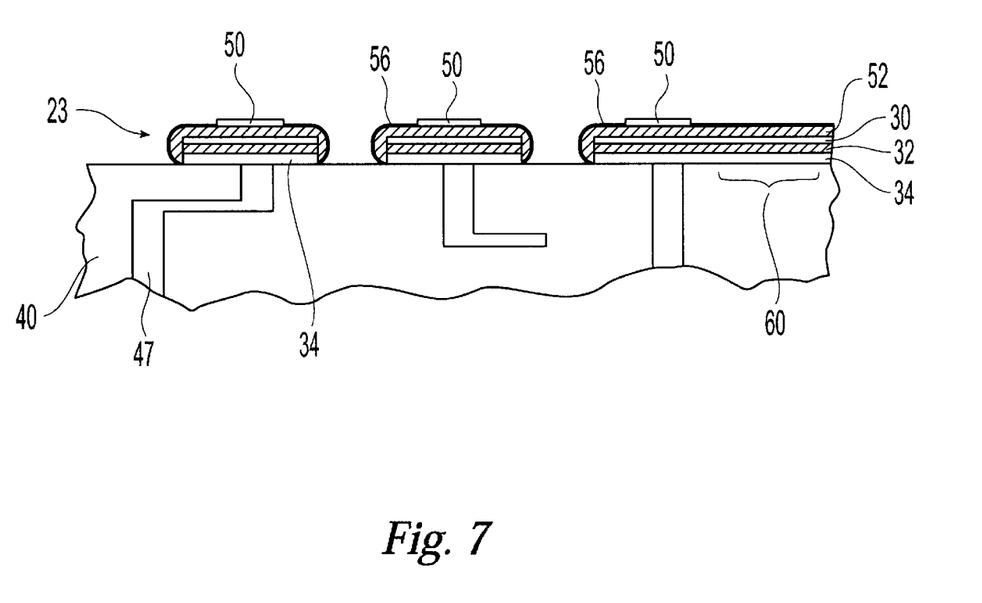
FIG. 7 illustrates a cross-sectional view of another embodiment of a PC board constructed according to the invention.

In another embodiment of the invention illustrated in the cross-sectional view of FIG. 7, a plated Ni outer layer is deposited over a base conductor layer having a multi-layered structure of Cu/Ni/Au layers 34, 32 and 30. Then a layer 50 of Au is selectively plated over plated Ni outer layer 52 to form bonding pads as described in the embodiment illustrated in FIG. 5. The resulting surface metallurgy has a Cu/Ni/Au/Ni structure with additional Au selectively plated on portions of the plated Ni outer layer to form the bonding pads. And as with the embodiment of the invention illustrated in FIGS. 5 and 6, native nickel-oxide layer 56 formed on the plated Ni outer layer 52 functions as a solder dam at bonding pads 23 preventing the molten solder from bleeding out onto surface-wiring structures 60 during the BGA bonding process.

Unlike the conventional system where the interface between the solder mask and the Au layer of the surface metallurgy is susceptible to degradation, such as de-lamination or peeling, the interface between the plated Ni outer layer and the underlying metal layer is less susceptible to such problems because of the excellent adhesion between Ni and the underlying metal layer which may be Cu or Au as discussed above. This property is well known especially in the electronics industry where Ni is used as an adhesion promoting interface layer between Au and a third metal as seen in the Cu/Ni/Au structure of the surface metallurgy on conventional PC boards.

The foregoing description, for purposes of explanation, used specific references to a BGA device. However, it would be apparent to one of ordinary skill in the art that the invention is applicable to other surface-mount devices where an organic solder mask is utilized in a similar manner as in the conventional BGA devices.

The illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

I claim:

1. A printed circuit board having at least one surface-mount-device bonding site comprising:

at least one surface having said at least one surface-mount device bonding site;

at least one base conductor layer plated on a portion of said surface;

at least one plated nickel outer layer on said base conductor layer; and an array of bonding pads formed by at least one selectively plated gold layer on a portion of said plated nickel outer layer and leaving a remainder of said plated nickel outer layer exposed to form a layer of native nickel-oxide, wherein said selectively plated gold layer on each of said bonding pads is substantially surrounded by said layer of native nickel-oxide and said array of bonding pads form said at least one surface-mount device bonding site.

2. A printed circuit board according to claim 1, wherein said plated nickel outer layer has a thickness in the range from about 0.075 mils to about 0.300 mils.

3. A printed circuit board according to claim 1, wherein said base conductor layer is copper.

4. A printed circuit board according to claim 1, wherein said base conductor layer has a multi-layered structure having copper, nickel, and gold layers where gold is the top layer.

5. A printed circuit board according to claim 1, wherein said surface-mount devices are solder ball-grid array devices.

6. A printed circuit board according to claim 1, wherein said surface-mount devices are solder column-grid array devices.

7. A method of forming a printed circuit board for mounting surface-mount devices comprising:

providing a printed circuit board having at least one surface having at least one surface-mount device bonding site;

plating at least one base conductor layer on a portion of said surface;

plating at least one plated nickel outer layer on said base conductor layer; and selectively plating at least one layer of gold on a portion of said plated nickel outer layer to form an array of gold bonding pads at said surface-mount device bonding site and leaving a remainder of said plated nickel outer layer exposed to form a layer of native nickel-oxide.

8. A method according to claim 7, wherein said plated nickel outer layer has a thickness in the range from about 0.075 mils to about 0.300 mils.

9. A method according to claim 7, wherein said base conductor layer is copper.

10. A method according to claim 7, wherein said base conductor layer has a multi-layered structure having copper, nickel, and gold layers where gold is the top layer.

11. The method of claim 7, wherein said surface-mount devices are solder ball-grid array devices.

12. The method of claim 7, wherein said surface-mount devices are solder column-grid array devices.

13. A printed circuit board having at least one surface-mount device bonding site comprising:

at least one surface having said at least one surface-mount device bonding site;

at least one base conductor layer plated on a portion of said surface;

at least one adhesion promoting layer plated on said base conductor layer wherein said adhesion promoting layer has a coefficient of thermal expansion that is substantially similar to that of said printed circuit board; and an array of bonding pads formed by at least one selectively plated gold layer on a portion of said adhesion promoting layer, wherein said adhesion promoting layer is a plated nickel outer layer and a portion of said plated nickel outer layer not covered by said selectively plated gold layer is exposed to form a layer of native nickel-oxide, wherein said selectively plated gold layer on each of said bonding pads is substantially surrounded by said layer of native nickel-oxide and said array of bonding pads form said at least one surface-mount device bonding site.

14. A printed circuit board according to claim 13, wherein said plated nickel outer layer has a thickness in the range from about 0.075 mils to about 0.300 mils.

15. A printed circuit board according to claim 13, wherein said base conductor layer is copper.

16. A printed circuit board according to claim 13, wherein said base conductor layer has a multi-layered structure having copper, nickel, and gold layers where gold is the top layer.

17. A printed circuit board according to claim 13, wherein said surface-mount devices are solder-ball grid array devices.

18. A printed circuit board according to claim 13, wherein said surface-mount devices are solder-column grid array devices.

19. A method of forming a printed circuit board for mounting surface-mount devices comprising:

providing a printed circuit board having at least one surface having at least one surface-mount device bonding site;

plating at least one base conductor layer on a portion of said surface;

plating at least one adhesion promoting layer on said base conductor layer wherein said adhesion promoting layer has a coefficient of thermal expansion that is substantially similar to that of said printed circuit board; and selectively plating at least one layer of gold on a portion of said adhesion promoting layer to form an array of gold bonding pads at said surface-mount device bonding site, wherein said adhesion promoting layer is a plated nickel outer layer and a portion of said plated nickel outer layer not covered by said selectively plated gold layer is exposed to form a layer of native nickel-oxide, Wherein said selectively plated gold layer on each of said bonding pads is substantially surrounded by said layer of native nickel-oxide and said array of bonding pads form said at least one surface-mount device bonding site.

20. A method according to claim 19, wherein said plated nickel outer layer has a thickness in the range from about 0.075 mils to about 0.300 mils.

21. A method according to claim 19, wherein said adhesion promoting layer is nickel.

22. A method according to claim 19, wherein said base conductor layer is copper.

23. A method according to claim 19, wherein said base conductor layer has a multi-layered structure having copper, nickel, and gold layers where gold is the top layer.

24. A method according to claim 19, wherein said surface-mount devices are solder-ball grid array devices.

25. A method according to claim 19, wherein said surface-mount devices are solder-column grid array devices.

* * * * *